United States Patent [19]

Barker

[11] Patent Number: 5,009,243

[45] Date of Patent: Apr. 23, 1991

[54] SOLAR HARNESS

[76] Inventor: Owen P. Barker, 455 W. State St. MD2, Trenton, N.J. 08618

[21] Appl. No.: 525,606

[22] Filed: May 21, 1990

Related U.S. Application Data

[63] Continuation-in-part of Ser. No. 889,167, Jul. 25, 1986, abandoned.

[51] Int. Cl.$^5$ .................. H01L 31/042; H01L 31/048; H01L 31/052
[52] U.S. Cl. ...................... 136/246; 136/244; 136/251; 136/292; 290/1 R; 310/300; 322/2 R
[58] Field of Search ............... 136/244, 246, 251, 292; 322/2 R; 310/300; 290/1 R

[56] References Cited

U.S. PATENT DOCUMENTS

| | | | |
|---|---|---|---|
| 2,823,245 | 2/1958 | Solow | 136/251 |
| 2,949,490 | 8/1960 | Jackson | 136/244 |
| 3,151,379 | 10/1964 | Escoffery | 437/4 |
| 3,422,527 | 1/1969 | Gault | 437/2 |
| 3,781,647 | 12/1973 | Glaser | 322/2 R |
| 3,933,323 | 1/1976 | Dudley | 244/1 R |
| 4,002,031 | 1/1977 | Bell | 60/641.15 |
| 4,045,246 | 8/1977 | Mlavsky et al. | 136/246 |
| 4,052,228 | 10/1977 | Russell | 136/246 |
| 4,078,747 | 3/1978 | Minovitch | 244/159 |
| 4,078,944 | 3/1978 | Mlavsky | 136/246 |
| 4,173,213 | 11/1979 | Kelly | 126/425 |
| 4,490,668 | 12/1984 | Sterzer | 322/2 R |

Primary Examiner—Aaron Weisstuch
Attorney, Agent, or Firm—Kenneth P. Glynn

[57] ABSTRACT

The present invention is directed to a solar harness apparatus which includes a plurality of solar cells with each having an active surface, that is, a surface which absorbs photons to generate electrical power, and these are arranged in a substantially parallel fashion with the active surfaces all facing the same direction and with the solar cells being stacked in line behind one another. The solar harness includes a plurality of magnets with at least one magnet being located between each adjacent solar cell in the plurality of solar cells so as to hold the cells in the stacked arrangement without any further support and so as to create solderless contacts therewith. Means is connected to the stack for drawing electric current therefrom. Preferably, the magnets are at least partially wrapped or wound in electrically conductive material so that the conductivity in series is enhanced. Further, the solar harness apparatus may be employed in conjunction with a parabolic reflector so as to work with concentrated solar energy, it may be used in conjunction with means for converting electrical energy to transmittable wave energy and deployed extraterrestrially. Alternatively, the present invention solar harness apparatus may be reversed with power being put into it so as to create a wave energy transmission device.

50 Claims, 4 Drawing Sheets

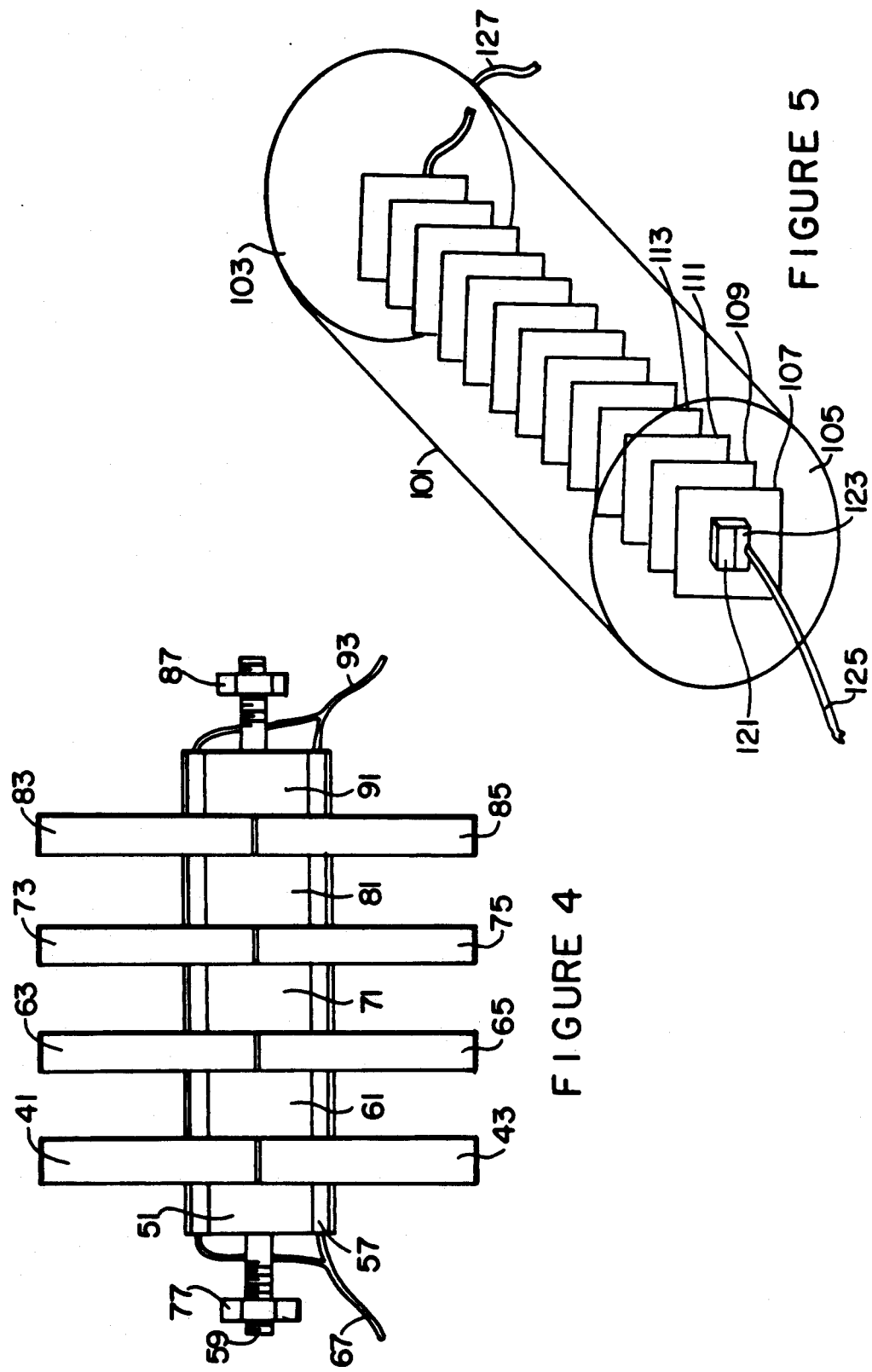

SOLAR HARNESS

REFERENCE TO RELATED APPLICATIONS AND INCORPORATION BY REFERENCE

This application is a continuation-in-part of copending U.S. patent application Ser. No. 06/889,167 (now abandoned), which was filed on July 25, 1986, entitled "Solar Harness" with Owen P. Barker, inventor. The present application incorporates herein by reference the entire specification of the aforesaid U.S. patent application Ser. No. 06/889,167.

BACKGROUND OF THE INVENTION

1. Field of the Invention

The present invention is directed to a solar harness for generating electricity, involving a stacked array of solar cells suspended in place magnetically. It is also directed to a solar harness system which includes the harness and a parabolic reflector in combination. The present invention is also directed to electricity generation systems which function in space in combination with power transmission to earth. The solar harness may be reversed and, when provided with electricity, may act as a preselected wave energy transmission system.

2. Prior Art Statement

Solar cell technology has been available for a number of years. Recently, efforts have been directed towards increased efficiency of solar cells, including the use of stacks or tandem arrays. Also, improved cell materials have been developed and specific unique approaches have been created to "capture" as much solar energy as possible within a given surface area. As exemplary of the prior art patents in this field, U.S. Pat. No. 2,949,498, issued to Edmond Jackson describes a solar energy converter where a number of different solar cell collectors are arranged in a stack whereby various semiconductor materials are utilized in the solar cells so that the energy gap of each solar cell corresponds to a different wave length of solar energy so as to increase the amount of energy captured for a given window or surface area through which solar energy may enter. This concept relies upon the fact that solar energy in the form of photons which are not absorbed by a particular solar cell may pass through it. These typically are of a different wave length than the photons being absorbed and, once passed through a first or a first and second solar cell, a subsequent solar cell which absorbs a different energy wave length may absorb such stragglers. U.S. Pat. No. 3,151,379 to Charles Escoffery describes a solar battery using a single wafer which is divided into a number of smaller solar cell wafers so as to then "wire" these smaller cells in series to increase the voltage output. U.S. Pat. No. 4,002,031 issued to Ronald Bell describes a solar energy converter which uses solar cells to convert sunlight into direct current and uses optical concentrators to reduce the needed area of the cells. Heat exchanger arrangements are also utilized to pick up what would otherwise be wasted heat energy and this may be converted to mechanical power, for example, in a Rankine engine cycle.

U.S. Pat. No. 3,422,527 to John Gault, describes the method of manufacturing high voltage solar cells wherein a number of wafers, for example a hundred or more wafers, are formed into a stack and soldered together in series. The assembled stack is then sliced longitudinally to form a plurality of slabs with a small transverse thickness of each slab. Leads are connected to the ends thereof. This appears to be another technique such as ascribed to Escoffery, described above, wherein a plurality of smaller surface areas are utilized to increase output voltage. U.S. Pat. No. 4,173,213 issued to Donald Kelly describes an alternative type of solar power system using high concentration linear reflective solar panels. Last, U.S. Pat. No. 2,823,245 issued to Benjamin Solow, describes a series of solar cells stacked so that the positive end of one cell contacts the negative end of the next cell directly and these are stacked in a tilted fashion and compressed by a spring cap into a tubular or elliptical glass housing. Here, the cells are maintained under the compressive force of the spring and necessarily require substantial support housing and conductive materials in order to complete the power of producing package.

Notwithstanding the formidable prior art, there is no teaching which shows or renders obvious the present invention solar harness which utilizes magnets in alternating series with solar cells to create a conductive magnetic field to simultaneously support the solar cells in a solderless fashion and to enhance the influx of energy to the solar cells to create a high voltage series of cells. Further, many of the other features of the present invention described herein are not suggested or taught in the prior art.

SUMMARY OF THE INVENTION

The present invention is directed to a solar harness apparatus which includes a plurality of solar cells with each having an active surface, that is, a surface which absorbs photons to generate electrical power, and these are arranged in a substantially parallel fashion with the active surfaces all facing the same direction and with the solar cells being stacked in line behind one another. The solar harness includes a plurality of magnets with at least one magnet being located between each adjacent solar cell in the plurality of cells so as to hold the cells in the stacked arrangement without any further support and so as to create solderless contacts therewith. Means is connected to the stack for drawing electric current therefrom. Preferably, the magnets are at least partially wrapped or wound in electrically conductive material so that the conductivity in series is enhanced. Further, the solar harness apparatus may be employed in conjunction with a parabolic reflector so as to work with concentrated solar energy and it may be used in conjunction with means for converting electrical energy to transmittable wave energy and deployed extraterrestrially. Alternatively, the present invention solar harness apparatus may be reversed with power being put into it so as to create a wave energy transmission device.

BRIEF DESCRIPTION OF THE DRAWINGS

The present invention will be more fully understood when the specification herein is taken in conjunction with the drawings appended hereto. These drawings are as follows:

FIG. 4 shows a side view of a present invention solar harness;

FIG. 5 shows an oblique frontal view of a solar harness of the present invention which includes an evacuated glass container;

DETAILED DESCRIPTION OF THE INVENTION

Figure 2:
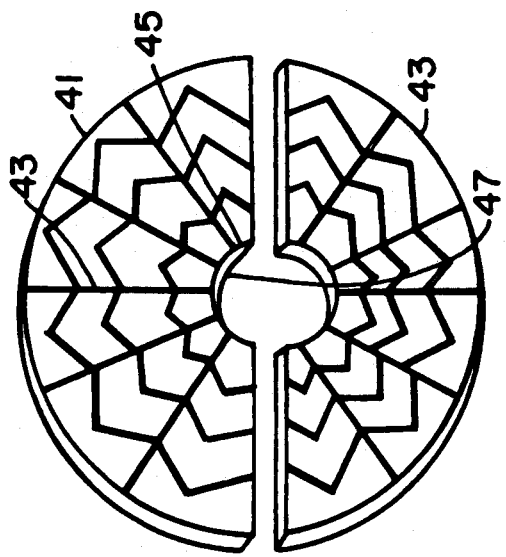
FIG. 2 shows a frontal view of an upper and lower silicon type solar cell which may be used in conjunction with a series of metal wrapped magnets to create a present invention solar harness.

As mentioned above, prior art solar cells have been combined for stacking to create improved efficiencies and have been glued or clamped together mechanically or otherwise. One of the primary difficulties with glued or otherwise permanently adhered or stacked silicon or other solar cell wafers, is the problem of thermal expansion and contraction of the various elements. It has been observed that many such systems fail due to cracking, breaking or separating under thermal stress. Additionally, the adhesive materials or other materials may act to decrease efficiency either in terms of photon movement or in terms of conductivity and increased resistance, or both. Furthermore, when the prior art systems do suffer damage, the replacement of a single damaged cell is virtually impossible and the array must be utilized in its partially destroyed condition or must be completely replaced.

The present invention solar harness is primarily directed to a plurality of solar cells with a plurality of magnets interspersed there between. In other words, an alternating arrangement of magnets and solar cells is assembled so that the solar cells can be held in a stack with many substantial advantages resulting therefrom. For example, as a result of the magnetic suspension of the solar cells, there is adequate room for thermal expansion and contraction without the individual solar cells being "stuck" in a tight, fixed position. Additionally, should the solar cells suffer some damage, one may be readily removed and replaced without the entire array being destroyed in the process. Additionally, there is increased efficiency as a result of the arrangement.

While this paragraph describes predominantly a hypothesis or theory, it should not be construed to be limiting with respect to the structural arrangement of the invention itself. Nonetheless, it has been found that substantial increases in output without substantial increases in surface area has been achieved by the arrangement of magnets and solar cells as used in the solar harness of the present invention. It seems that the magnets act to draw in photons so that more photons are striking the solar cell surface and being absorbed. Additionally, in a given stack, the magnets may accelerate the movement of photons and those that are not absorbed in the first solar cell of a stack may be pulled toward each of the next sequential solar cells in a stack until absorbed. This phenomenon decreases the random deflection of unabsorbed photons and therefore substantially increases solar cell photon absorption and ultimate electrical production. Additionally, the magnets themselves are preferably wrapped or wound with a conductive material such as a conductive foil, or a conductive wire or a conductive coating of highly conductive metals such as nickel, copper, silver, gold or the like. The windings or wrappings of conductive material may be the same for a series of magnets, may involve opposite windings on each magnet and/or variable windings, depending upon desired voltage and amperage. In one preferred embodiment, there are two (opposite) windings on each magnet and all magnets (except those end magnets with leads) are identical.

The highly conductive magnets such as the aforementioned wrapped magnets may actually be performing four different functions: (1) the movement of photons towards a given solar cell surface; (2) the bending of electrons which might otherwise miss a solar cell surface towards the actual solar cell itself; (3) the movement of unabsorbed photons passing through a given solar cell towards the surface of the next adjacent solar cell; (4) the conduction of current down the stack of solar cells so as to increase electrical output in series. Of course, additionally, the magnets perform the very important mechanical functions of holding the solar cells in a given arrangement and of allowing solar cells to be added, removed, or substituted in a given array.

In addition to the solar harness of the present invention, it has been discovered that the solar harness, when placed in an evacuated container, will experience further increased efficiency and increased output. Thus, the present invention solar harness may include a container which is transmissive to sunlight and this may be partially or completely made of glass, quartz or similar material. Additionally, it may be partially or nearly completely evacuated or the air may be replaced with a more useful gas such as inert gases like neon or such as other gases which are easily ionizable. It is believed that the substitution of air with these kinds of gases or the removal of a substantial number of air molecules allows for more photons to arrive at the solar cell surfaces.

In addition, the solar harness may be located at the focal point of a paraboloidal reflector so that concentrated solar energy may be absorbed by the solar harness. Further, it has been discovered that, as a result of the particular geometry of a parabolic reflector and the fact that a glass or plastic or other coating is involved in the mirror of such a device, that the specific refractive index of the material of which the deflector is constructed will cause a prismatic break up of various wavelengths of sunlight and may place the very hot, red color light waves at a focal point different from the focal point where the blue, the green or the violet light might be found. As a result, it has been discovered that a solar harness of the present invention, when located at the focal point corresponding to the very hot, red color concentrated sunlight may burn up but, when placed at the focal point or points of the cooler wavelengths, will generate substantial electric current without suffering from extreme heat.

In addition, the solar harness, since it is very efficient in a vacuum or partial vacuum, would be a preferred device for extraterrestrial use and may, in conjunction with a system for conversion of electric power to wave transmissible power, be used in space. For example, the collected solar energy may be converted to electricity and then microwave power and transmitted by microwave transmission to earth from a satellite station or space station or the like.

In yet another embodiment, the present invention may be used to transmit wave energy by reversing the use of the solar harness. For example, depending upon the particular arrangements, a solar harness may be selected to generate a distinctive wavelength in a distinctive fashion and the input of electricity in conjunction with a parabolic reflector may "shoot" wave energy to a receiving unit where communications may be possible.

In addition to the above, it should be noted that a very long array of solar cells used in a solar harness arrangement of the present invention may be logistically placed within the cooler color wavelength focal points of a linear parabolic collector or reflector. Other uses and applications should become apparent as suggested herein and as may now occur to the artisan.

Figure 1:
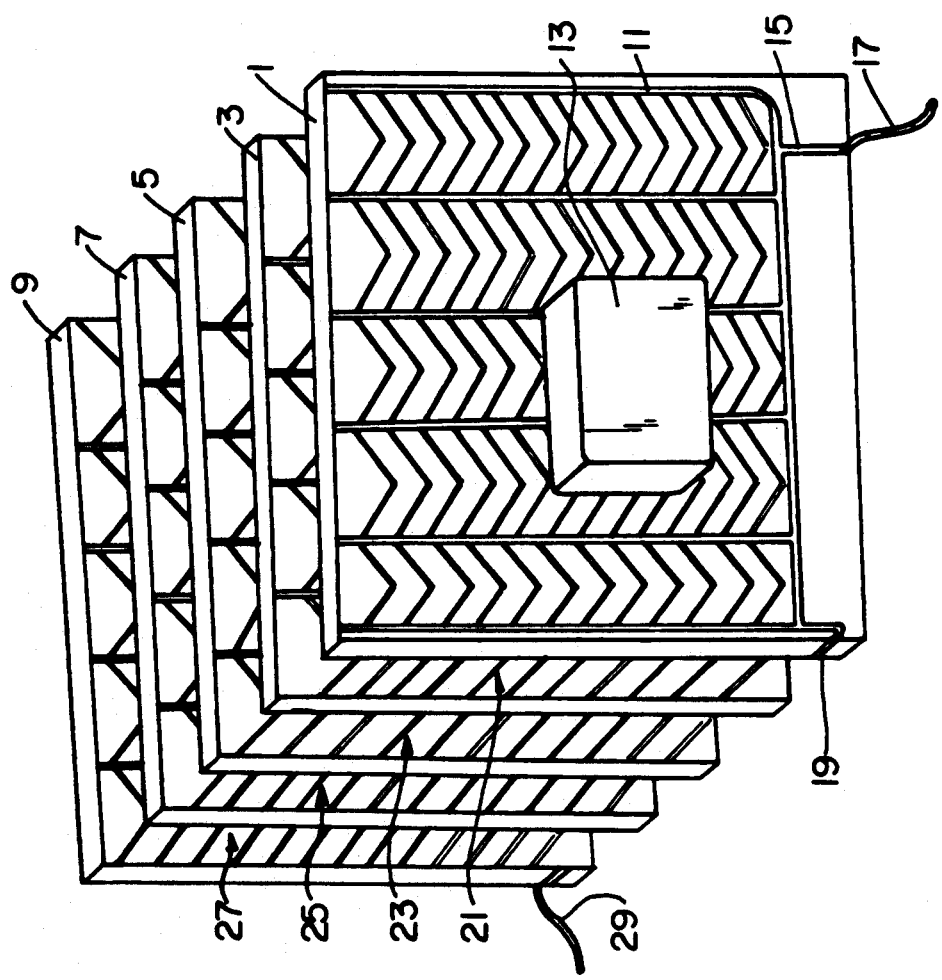
FIG. 1 shows a front view of a stack of solar cells and magnets, embodying a preferred embodiment of the present invention.

Referring now more specifically to FIG. 1, there is shown a stack of solar cells 1, 3, 5, 7 and 9. These are arranged so that their active surfaces typified by active surface 11 are all facing the same direction. Further, in front of solar cell 1 is magnet 13 and located between the solar cells are spaces 21, 23, 25 and 27 with magnets (not shown) located between each adjacent solar cell within the spaces. In fact, the magnets create the spaces. The magnets such as magnet 13 hold the solar cells in a single array without the need for any mechanical attachment and "suspend" these solar cells in place so as to permit thermal expansion and contraction, so as to permit easy removal of a defective or worn cell, and so as to permit replacement, increase or decrease of the number of cells in the stack. Additionally, as mentioned above, the magnets, for some reason, tend to cause increased absorption of photons and somehow draw or direct the photons to the solar cells so as to increase electrical output. Solar cell 1 has an electrode 15 connected to a wire 17. On its adverse, solar cell 1 has the opposite electrode 19 and this would be connected in series with the electrode on the front of solar cell 3 and so on. The exact means of connection is not critical, but snap-together wiring such as male/female socketing, alligator clip arrangements, or the like may be used. In the alternative, conductivity through wound or wrapped magnets may be relied upon without the need for connecting each solar cell sequentially. In any event, the opposite electrode is attached to wire 29 as shown in FIG. 1. This solar harness shown in FIG. 1 may be utilized to generate substantial power increase without substantially increasing the need for surface area.

The exact type of magnet is not critical and the magnets need only be of adequate power to hold the solar cells securely in place. However, stronger magnets may increase electrical output significantly more than weaker magnets. Likewise, the particular design of the solar cell or the particular make up of the active solar cell material is not critical and any conventional solar cell may be utilized.

Figure 3:
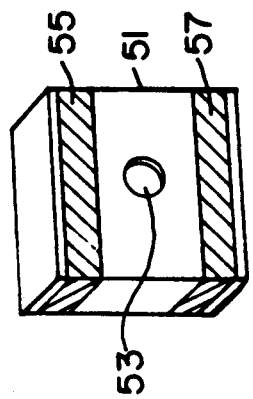
FIG. 3 shows a magnet having two copper strips wrapped about it for use with the type of solar cells such as are shown in FIG. 2.

FIG. 2 shows an arrangement of two solar cells which are semicircular with a cut out in the center and these may be made of any conventional material. Thus, both solar cell 41 and solar cell 43 are shown and in solar cell 41, cut out 47 is indicated. Further, solar cell 41 includes current collector paths 43 and electrode contact 45, as shown. FIG. 3 shows a magnet 51 which may be utilized in the present invention arrangements to create solar harnesses, including that shown in FIG. 1 as well as in conjunction with the solar cells 41 and 43 shown in FIG. 2. Magnet 51 includes copper or other conductive material wrapping 55 and 57 as shown. In this embodiment, the conductive material wrappings 55 and 57 are copper foils but could readily be silver foils or silver wires or silver coating or gold or any other conductive material. In the center of magnet 51 is orifice 53. This orifice may optionally be used for a non-conductive or insulated rod to pass there-through, without the need for tight bolting or the like. The solar cells 41 and 43 of FIG. 2 may be utilized with magnet 51 as shown in FIG. 3 and this is described in conjunction with FIG. 4 below.

FIG. 4 shows a side view of a stack of eight (8) semicircular solar cells, 41, 43, 63, 65, 73, 75, 83 and 85. Located therebetween and at each end are magnets 51, 61, 71, 81 and 91. Rod 59 passes through the orifices in the magnets and nuts 77 and 87 are loosely screwed on. This provides for a convenient way to carry the solar harness but in no way operates to secure the solar cells in place. The magnets such as magnet 51 include conductive foils as typified by copper foil 57. Lead electrode wires 67 and 93 are attached to opposite ends as shown for drawing current therefrom. The array shown in FIG. 4 may be utilized to increase substantially the output for a given surface area and, due to its configuration, may be carried in a glass tubing. In a preferred embodiment, it is stored in a glass tubing which is evacuated and which is believed to increase the efficiency of the electrical output.

In order to test the present invention, a four inch by four inch solar cell was exposed to optimum angled sunlight and attached to a volt meter. It was discovered that the cell yielded 0.5 volts. A second arrangement was made which would comprise a solar harness of the present invention, as follows: 2 four inch by four inch solar cells of the type mentioned were arranged with 3 magnets to create a present invention solar harness. Specifically, the magnets as shown in FIG. 3 were arranged with one magnet between the two solar cells, one magnet on the front of the front solar cell and one magnet on the rear side of the rear solar cell. The magnets were arranged so that the positive terminal was on the front side and the negative terminal was on the back side, all of this is not critical. Without the necessity for doubling the surface area, even though two solar cells were being used, the stack was arranged so that the separation of the two solar cells was less than one inch and, under any sun exposure, the second solar cell would be shadowed predominantly or entirely by the first solar cell or the angle of the sun would be very acute and diminished in power. Nonetheless, with sunlight entering the front solar cell at right angles and with sunlight approaching the two solar cells at approximately 45 degrees from their surfaces, as a result of the magnets, a yield of 1 volt was achieved. Thus, the magnets appeared to have drawn additional photons to the solar cells and at least doubled the voltage output while minimizing the increase in necessary surface area. Based on these results, it can now be seen that a solar harness of the present invention utilized in conjunction with an electric vehicle would take up only a few square feet of surface area rather than the entire vehicle to have solar recharging of the batteries. Other applications where surface area is essential should now be apparent.

FIG. 5 shows an oblique front view of a present invention solar harness which was actually constructed. The glass container 101 has a solid back end 103 and a glass front end 105 and has contained therein an array of solar cells such as solar cells 107, 109, 111 and 113. Magnets are located therebetween and front magnet 121 is shown. Magnet 121 is wrapped with conductive foil 123 and wired with electrode wire 125. Likewise, opposite electrode wire 127 exits the rear of glass container 101. The FIG. 5 device was actually tested and, with an arrangement of four inch by four inch solar cells stacked in a container of approximately fifteen inches in length, 12 volts of current was generated at optimal solar light exposure.

Figure 6:
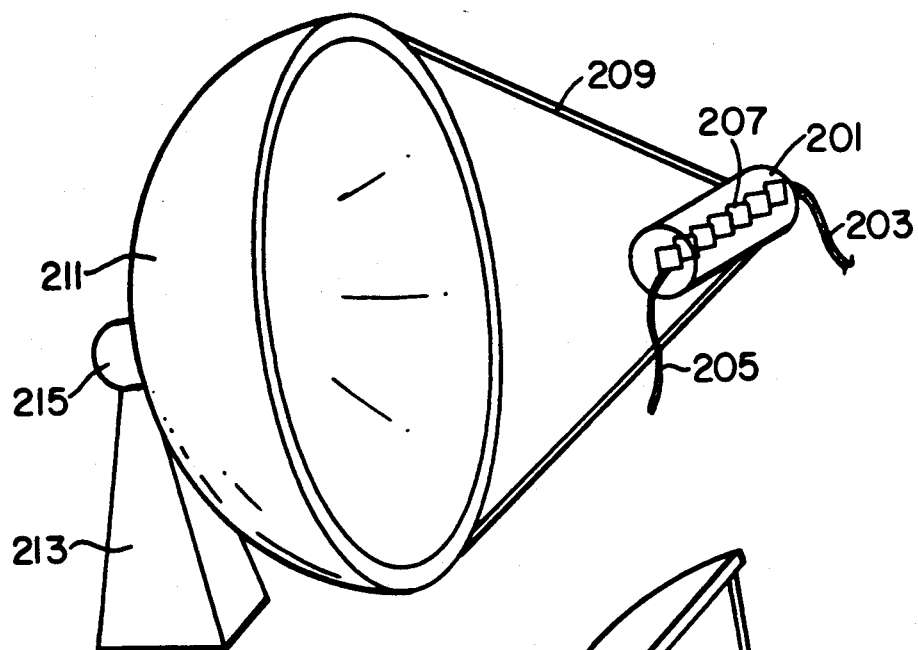
FIG. 6 shows a side perspective view of a paraboloidal reflector used in conjunction with a solar harness of the present invention.

FIG. 6 shows another embodiment of the present invention in which the present invention solar harness is used in conjunction with a parabolic collector. Thus, collector 211 is located on base 213 and moveable via rotational element 215. Support rod 209 holds glass container 201 which includes a solar harness 207 as described above. Electrode wires 203 and 205 exit opposite ends as shown. The solar harness 207 is contained within glass container 201 under vacuum and is held in place by brackets such as bracket 209. It should be noted that the specific location of container 201 is based upon a determination of the "cool" color bands of solar energy which are reflected by parabolic collector 211. In other words, as described above, the refractive index and the prismatic effect of the collector 211 will cause a separation or series of focal points and the present invention solar harness, when placed in the cool color focal point area and outside of the red color burning area focal point, achieves substantially improved voltage output.

Figure 7:
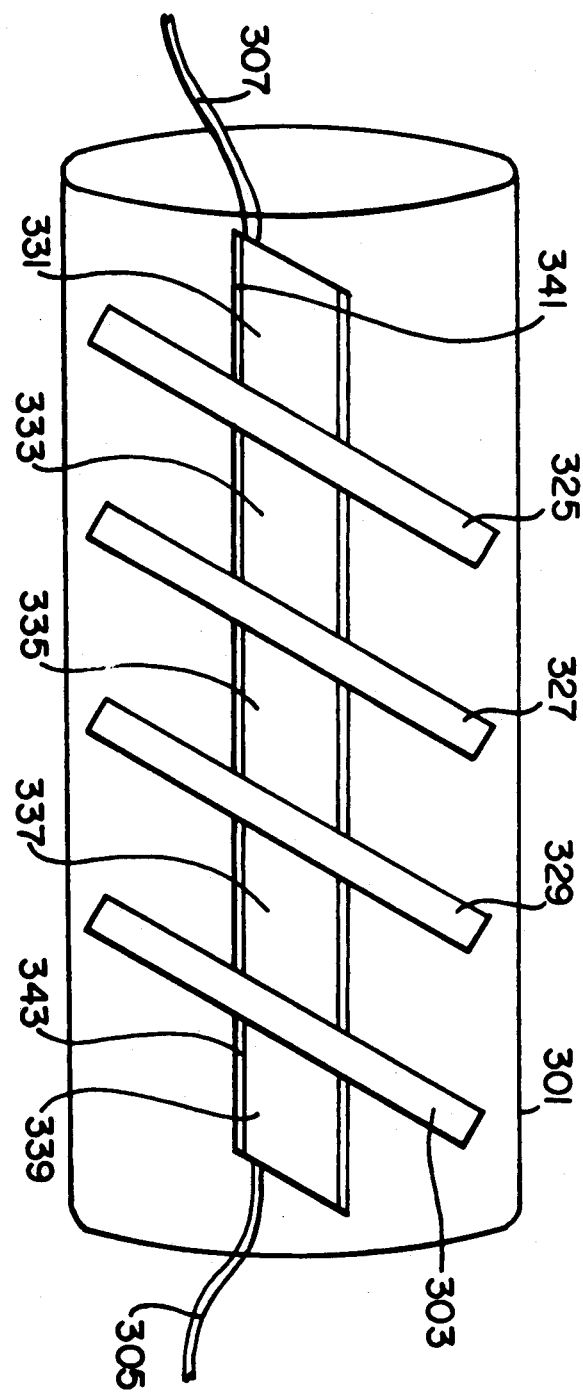
FIG. 7 shows a side view of another preferred embodiment of a solar harness of the present invention which includes an evacuated glass container; and, FIG. 8 shows a side perspective view of a linear parabolic reflector when used in conjunction with a solar harness of the present invention.

FIG. 7 shows yet another alternative embodiment with container 301 and electrode wires 307 and 305 connected to parallelogram magnets 331, 333, 335, 337 and 339. Solar cells 325, 327, 329 and 303 are arranged in between these to create a solar harness stack of the present invention. Further, the parallelogram magnets include conductive silver foil as shown with respect to magnet 331 as foil 341 and with respect to magnet 339 as foil 343. This type of arrangement will allow for sunlight coming in at less than 90 degree angles to the surface of each of the solar cells and yet will allow the solar harness to be arranged in a continuous columnar stack. Thus, the container 301 with the present invention solar harness may be utilized in conjunction with a linear parabolic collector such as is described with respect to FIG. 8.

Figure 8:
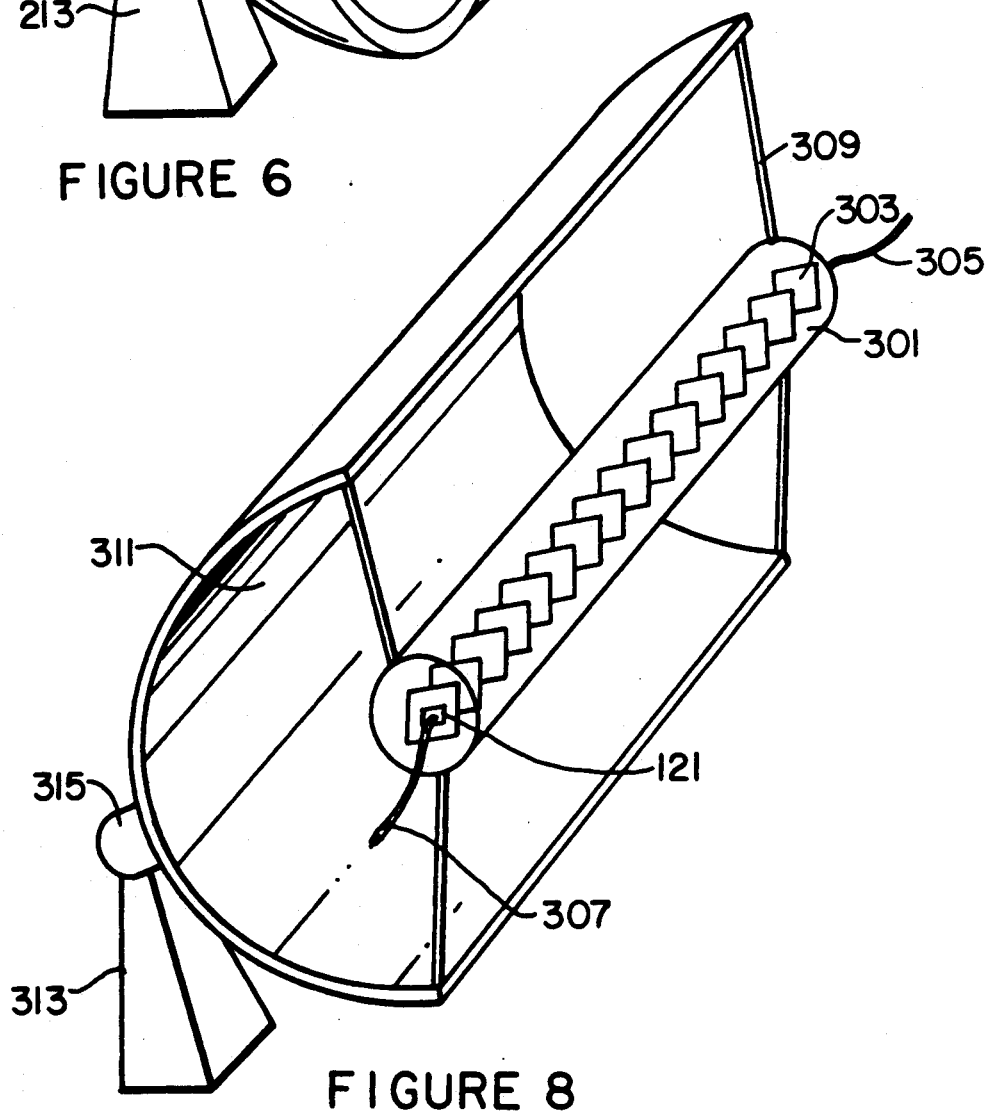

As shown in FIG. 8 linear parabolic collector 311 is attached to base 313 via connecting mechanism 315. Brackets such as bracket 309 hold glass container 301 with the present invention solar harness which includes the magnets and the solar cells such as solar cell 303. Again, the solar harness must be placed within the focal point of the cooler colors of the collected and concentrated sunlight so as to prevent burn up and so as to afford maximum power output.

In addition to the above embodiments, the present invention also includes the use of the solar harness in extraterrestrial applications and particularly in outer space as well as in orbital fixation about the earth. In these embodiments, the solar harness may be used to generate power directly for a space station, a space vehicle, a satellite or the like, or it may be used in conjunction with means of converting the electric energy to a wavelength which is transmissible to the earth. For example, the current could be converted to microwave energy and beamed back down to a receiving unit located on the earth or, for that matter, located on another space vehicle, satellite, space station or the like.

Finally, the present invention may be used in a reversed mode wherein power is inputted into the solar harness and wave energy is generated from the solar cells and, when transmitted towards a collector, will be reflected outwardly in a preselected direction so as to be received by a similar system at a remote receiving location. The particular wave length chosen and the capability in terms of distance of transmission is dependent upon the selection of the particular solar cells, their arrangement, the amount of power inputted, and the particular arrangement of the reflector transmitter which may be utilized in conjunction therewith.

Obviously, numerous modifications and variations of the present invention are possible in light of the above teachings. It is therefore understood that within the scope of the appended claims, the invention may be practiced otherwise than as specifically described herein.

What is claimed is:

1. A solar harness apparatus, comprising:
   (a) a plurality of solar cells, each having, an active surface, with said active surface of each solar cell being substantially parallel to one another and facing the same direction, and with said solar cells being stacked in line behind one another,
   (b) a plurality of magnets, with at least one magnet being located between each adjacent solar cell in said plurality of cells, each of said magnets being of adequate magnetic power to hold said plurality of solar cells in stacked arrangement therewith, without any other support and so as to create solderless contacts with each solar cell in series;
   (c) means connected to said stacked arrangement of plurality of solar cells and magnets for drawing electric current therefrom.

2. The solar harness apparatus of claim 1 wherein said magnets are at least partially wound in an electrically conductive material.

3. The solar harness apparatus of claim 2 wherein said magnets are located at an electrode built into the active surface of each of said solar cells.

4. The solar harness apparatus of claim 2 which further comprises:
   (d) support means for holding said magnets in place.

5. The solar harness apparatus of claim 2 wherein said conductive material is a conductive wire or foil.

6. The solar harness apparatus of claim 1 wherein said active surface of each said solar cells is a flat surface.

7. The solar harness apparatus of claim 6 which further comprises:
   (d) support means for holding said magnets in place.

8. The solar harness apparatus of claim 1 wherein all of said solar cells are of equal size.

9. The solar harness apparatus of claim 8 wherein said magnets are located at an electrode built into the active surface of each of said solar cells.

10. The solar harness apparatus of claim 8 which further comprises:
    (d) support means for holding said magnets in place.

11. The solar harness apparatus of claim 1 wherein said magnets are centrally located relative to the active surface of each of said solar cells.

12. The solar harness apparatus of claim 11 which further comprises:
    (d) support means for holding said support in place.

13. The solar harness apparatus of claim 1 wherein said magnets are located at an electrode built into the active surface of each of said solar cells.

14. The solar harness apparatus of claim 1 wherein said magnets only partially overlap the active surface of each of said solar cells.

15. The solar harness apparatus of claim 1 which further comprises:
(d) support means for holding said magnets in place.

16. The solar harness apparatus of claim 15 wherein said magnets have an orifice located therein and said support means is a rod having end caps.

17. The solar harness apparatus of claim 1 which further comprises a solar light transmissive container which contains said plurality of solar cells and magnets.

18. The solar harness apparatus of claim 17 wherein said container is at least partially glass.

19. The solar harness apparatus of claim 17 wherein said container is at least partially evacuated.

20. The solar harness apparatus of claim 17 wherein said container is at least partially filled with gases other than air.

21. A solar harness system, which comprises:
(a) a parabolic reflector having a specific theoretical focal point and having a series of focal points for the different colored light rays contained in solar lights;
(b) means for supporting said parabolic reflector;
(c) a solar harness apparatus, including:
 (i) a plurality of solar cells, each having an active surface, with said active surface of each solar cell being substantially parallel to one another and facing the same direction, and with said solar cells being stacked in line behind one another;
 (ii) a plurality of magnets, with at least one magnet being located between each adjacent solar cell in said plurality of cells, each of said magnets being of adequate magnetic power to hold said plurality of solar cells in stacked arrangement therewith, without any other support and so as to create solderless contacts with each solar cell in series;
 (iii) means connected to one end of said stacked arrangement of plurality of solar cells and magnets for drawing electric current therefrom;
(d) means for supporting said solar harness apparatus at the focal point of a color of the colored light rays in solar light other than the red color focal point.

22. The solar harness system of claim 21 wherein said magnets are at least partially wound in an electrically conductive material.

23. The solar harness system of claim 22 wherein said magnets are located at an electrode built into the active surface of each of said solar cells.

24. The solar harness system of claim 22 wherein said conductive material is a conductive wire or foil.

25. The solar harness system of claim 21 wherein said active surface of each said solar cells is a flat surface.

26. The solar harness system of claim 25 wherein said magnets are located at an electrode built into the active surface of each of said solar cells.

27. The solar harness system of claim 21 wherein all of said solar cells are of equal size.

28. The solar harness system of claim 27 wherein said magnets are located at an electrode built into the active surface of each of said solar cells.

29. The solar harness system of claim 21 wherein said magnets are located at an electrode built into the active surface of each of said solar cells.

30. The solar harness system of claim 21 wherein said magnets only partially overlap the active surface of each of said solar cells.

31. The solar harness system of claim 21 which further comprises support means for holding said magnets in place.

32. The solar harness system of claim 31 wherein said magnets have an orifice located therein and said support means is a rod having end caps.

33. The solar harness system of claim 21 which further comprises a solar light transmissive container which contains said plurality of solar cells and magnets.

34. The solar harness system of claim 33 wherein said container is at least partially glass.

35. The solar harness system of claim 33 wherein said container is at least partially evacuated.

36. The solar harness system of claim 33 wherein said container is at least partially filled with gases other than air.

37. The solar harness system of claim 21 which further includes means connected to said parabolic reflector and said connected solar harness apparatus for rotation of same to track the solar light rays for optimal incidence.

38. An extraterrestrial solar harness apparatus, comprising:
(a) a plurality of solar cells, each having an active surface, with said active surface of each solar cell being substantially parallel to one another and facing the same direction, and with said solar cells being stacked in line behind one another;
(b) a plurality of magnets, with at least one magnet being located between each adjacent solar cell in said plurality of cells, each of said magnets being of adequate magnetic power to hold said plurality of solar cells in stacked arrangement therewith, without any other support and so as to create solderless contacts with each solar cell in series;
(c) means connected to said stacked arrangement of plurality of solar cells and magnets for drawing electric current therefrom; and,
(d) means for converting said electric current to transmittable concentrated wave energy and for transmitting said concentrated wave energy to earth.

39. The extraterrestrial solar harness apparatus of claim 38 wherein said magnets are at least partially wound in an electrically conductive material.

40. The extraterrestrial solar harness apparatus of claim 39 wherein said magnets are located at an electrode built into the active surface of each of said solar cells.

41. The extraterrestrial solar harness apparatus of claim 39 wherein said conductive material is a conductive wire or foil.

42. The extraterrestrial solar harness apparatus of claim 38 wherein said active surface of each said solar cells is a flat surface.

43. The extraterrestrial solar harness apparatus of claim 38 wherein all of said solar cells are of equal size.

44. The extraterrestrial solar harness apparatus of claim 38 wherein said magnets are located at an electrode built into the active surface of each of said solar cells.

45. The extraterrestrial solar harness apparatus of claim 38 wherein said means for converting and transmitting is means for converting to and transmitting microwave energy.

46. The extraterrestrial solar harness apparatus of claim 38 wherein said magnets only partially overlap the active surface of each of said solar cells.

47. The extraterrestrial solar harness apparatus of claim 38 which further comprises support means for holding said magnets in place.

48. The extraterrestrial solar harness apparatus of claim 38 wherein said magnets have an orifice located therein and said support means is a rod having end caps.

49. The extraterrestrial solar harness apparatus of claim 38 which further comprises a solar light transmissive container which contains said plurality of solar cells and magnets.

50. The extraterrestrial solar harness apparatus of claim 49 wherein said container is at least partially glass.

* * * * *